United States Patent
Tung

[19]

[11] Patent Number: 6,117,738
[45] Date of Patent: Sep. 12, 2000

[54] METHOD FOR FABRICATING A HIGH-BIAS SEMICONDUCTOR DEVICE

[75] Inventor: Ming-Tsung Tung, Hsinchu Hsien, Taiwan

[73] Assignee: United Microelectronics Corp., Hsinchu, Taiwan

[21] Appl. No.: 09/196,933

[22] Filed: Nov. 20, 1998

[51] Int. Cl.[7] .................................................. H01L 21/336
[52] U.S. Cl. ..................... 438/286; 438/510; 438/514; 438/527; 257/333
[58] Field of Search ................................... 438/199, 197, 438/286, 510, 514, 527, 285, 262; 257/333

[56] References Cited

U.S. PATENT DOCUMENTS

| | | | |
|---|---|---|---|
| 4,717,679 | 1/1988 | Baliga et al. ............................ | 438/237 |
| 5,242,841 | 9/1993 | Smayling et al. ...................... | 438/275 |
| 5,304,827 | 4/1994 | Malhi ...................................... | 257/262 |
| 5,306,652 | 4/1994 | Kwon et al. ............................ | 438/283 |
| 5,444,002 | 8/1995 | Yang ....................................... | 438/286 |
| 5,510,275 | 4/1996 | Malhi ..................................... | 438/285 |
| 5,548,147 | 8/1996 | Mei ........................................ | 257/333 |

*Primary Examiner*—John F. Niebling
*Assistant Examiner*—Christopher Lattin
*Attorney, Agent, or Firm*—Hickman Coleman & Hughes, LLP

[57] ABSTRACT

A method for fabricating an improved structure of a high-bias device includes forming multiple doped wells between source/drain regions and a P-type substrate. The doped wells have an increasing order of dopant density from the P-type substrate for the P-type dopant or from a first N-type well for an N-type dopant. The doped multiple wells enclose the source/drain regions so that the source/drain regions do not directly contact with the substrate.

20 Claims, 3 Drawing Sheets

6,117,738

METHOD FOR FABRICATING A HIGH-BIAS SEMICONDUCTOR DEVICE

BACKGROUND OF THE INVENTION

1. Field of the Invention

This invention relates to a semiconductor device, and more particularly to using different dopant-types and different dopant densities to fabricate a semiconductor device with high bias tolerance.

2. Description of Related Art

As the size of semiconductor device is reduced, the channel length is accordingly reduced, resulting in a semiconductor device with a faster operational speed. However, even though the shorter channel length raises the operational speed, a channel length that is too short creates other serious problems. These problems are generally called the short channel effect and are described as follows. If the bias applied on the semiconductor device is kept constant but the channel length is shortened, according to a formula of "electric field (E-field)=bias/channel length", where E-field is measured in units of "V/m", the electrons within the channel gain more energy due to the stronger E-field so that the possibility of an electrical breakdown is higher.

Electric breakdown occurring on a high-bias semiconductor device is usually earlier than a low-bias semiconductor device because a potential crowding phenomenon occurring around a drain surface of a field effect transistor (FET) is earlier for the high-bias device. An electric breakdown voltage therefore can not be easily increased. In order to increase the electric breakdown voltage, the dopant density in drift regions of the FET need to be decreased but the decrease of dopant density consequently reduces the driving current and results in a poor device performance. Moreover, a high-bias device needs to consider a latch-up phenomenon between device components. A loose circuit layout may be taken to solve the latch-up but it then deteriorates the integration of the device.

Conventionally, the electric breakdown voltage of a high-bias device can be obtained by forming an additional isolation structure between the source/drain regions and the gate of a FET so as to increase the distance between each other. The additional isolation structure can reduce the horizontal electric field in the channel of the FET. Moreover, a lightly doping region is formed under the additional isolation structure and the source/drain regions so that hot electron effect can be reduced and increase the tolerance of high bias. The high-bias device thereby can normally works at a high bias power source.

FIG. 1 is a cross-sectional view of a conventional high-bias device. In FIG. 1, a field oxide structure 102, an additional isolation structure 103 and a gate 104 are formed on a p-type semiconductor substrate. In the substrate 100, an N$^+$-type source region 106 and an N$^+$-type drain region 108 are formed around the gate 104. The additional isolation structure 103 is located between the gate 104 and the source/drain region 108. A P-type doped region 110 is formed under the source region 106 and an N$^-$-type doped region 112 is formed under the additional isolation structure 103. The additional isolation structure 103, the P-type doped region 110, and the N$^-$-type doped region 112 are used to solve the problems of the short channel length so that the electric breakdown voltage can be increased to allow the device to work at a high bias source.

However, the N$^-$-type doped region 112 locates beside the N$^+$-type drain region 108, which still has a contact area with the substrate 100. The potential crowding phenomenon can still easily occurs at the contact area. The electric breakdown voltage is not as high as the one desired. Moreover, it is insufficient of available space for adjusting the electric field specially used for the high-bias device.

SUMMARY OF THE INVENTION

It is therefore an objective of the present invention to provide a method for fabricating an improved structure of a high-bias device. The structure includes multiple lightly doped regions formed between a drain region and a semiconductor substrate, at which the potential crowding phenomenon is prevented from occurring. The drain does not directly contact with the substrate so that the junction electric field is reduced. Therefore, the electric breakdown voltage is increased.

It is another an objective of the present invention to provide a method for fabricating an improved structure of a high-bias device. The structure includes multiple lightly doped regions between the source/drain regions and the substrate so as to increase the avoidance of the latch-up phenomenon.

In accordance with the foregoing and other objectives of the present invention, a method for fabricating an improved structure of a high-bias device is provided. An oxide layer is formed over a semiconductor substrate, such as a P-type substrate. A first P-type well (P well) and a first N-type well (N well) are sequentially formed in the P-type substrate in different regions. A second P well is formed in the first P well. A second N well is simultaneously formed in the second P well and the first N well. A pad oxide layer and a field oxide layer are formed over the substrate. The field oxide layer covers a portion of the first N well and the second N well within the first N well region. A gate including, for example, polysilicon is formed around between the first P well region and the first N well, in which the gate covers a portion of the second N well and a portion of the field oxide layer. An N$^+$ doped region is formed on the second N well in the substrate to serve as source/drain regions. A P$^+$ well is formed between the second P well, the second N well, and one of the N$^+$ source/drain regions with some contact area. For the same type of dopant, the doped region closer to the substrate has lighter dopant density.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENTS

There are four preferred embodiment to be described below. The invention includes several doped wells with different dopant density, which is the closer to the substrate the lighter dopant density. The wells also prevent the source/drain regions from directly contacting with the original P-type substrate. Hence, the electric breakdown voltage is increased, and the latch-up phenomenon is effectively avoided.

EXAMPLE 1

Figure 1:
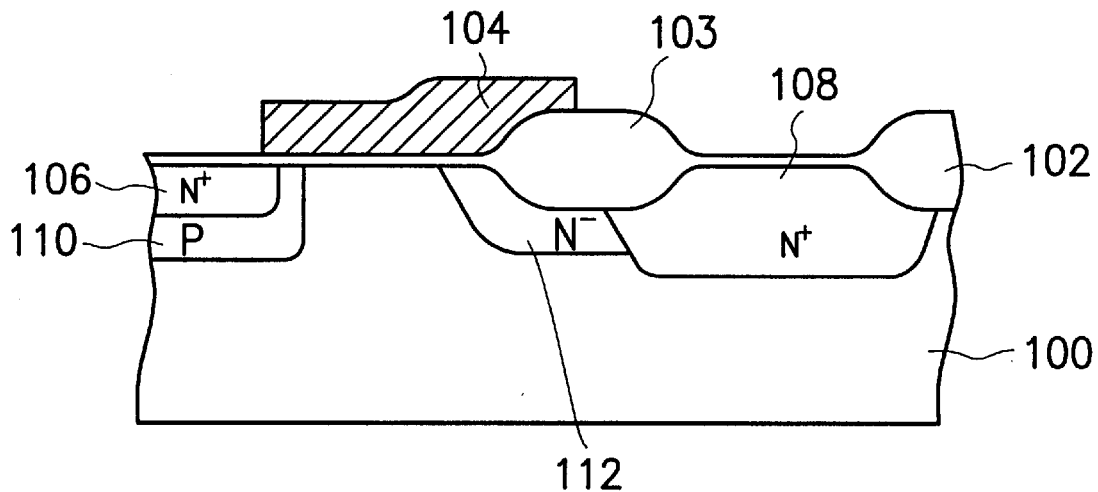
FIG. 1 is a cross-sectional view of a conventional high-bias device.
Figure 2A:
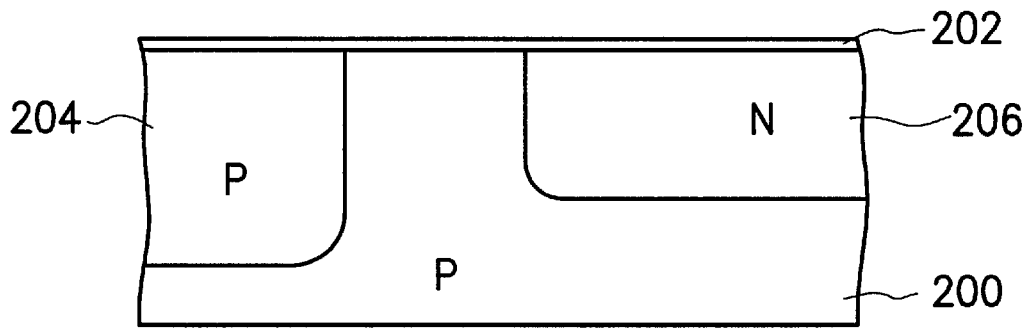
FIGS. 2A–2E are cross-sectional views of an improved high-bias device, schematically illustrating a fabrication process for the improved high-bias device, according a first preferred embodiment of the invention.

FIGS. 2A–2E are cross-sectional views of an improved high-bias device, schematically illustrating a fabrication process for the improved high-bias device, according a first preferred embodiment of the invention. In FIG. 2A, an oxide layer 202 is formed over a semiconductor substrate, such as a P-type substrate 200. A first P-type well (P well) 204 and a first N-type well (N well) 206 are separately formed in the substrate 200. The formation of the first P well 204 includes, for example, forming a P well masking layer (not shown) and performing P-type ion implantation. The formation of the first N well 206 includes, for example, forming an N well masking layer (not shown) and performing N-type ion implantation. After ion implantation, a drive-in process, such as a thermal process, is performed to drive in implanted ions from the substrate surface. The P well 204 has a dopant density greater than the P-type substrate 200.

Figure 2B:
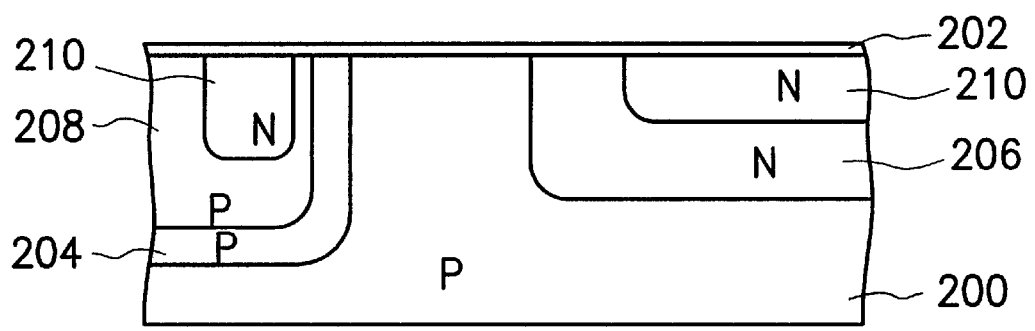

In FIG. 2B, using a second P well masking layer (not shown), a second P well 208 is formed inside the first P well by, for example, implanting P-type ions and performing a drive-in process, such as a thermal process. The dopant density of the second P well 208 is greater than that of the first P well. Using a second N-type well masking layer (not shown), an N-type dopant is implanted into a portion of the surfaces of the second P well 208 and the first N well 206. A drive-in process, such as a thermal process, is performed. A second N well 210 is formed on the second P well 208 and the first N well 206. The dopant density of the second N well is greater than that of the first N well.

Figure 2C:
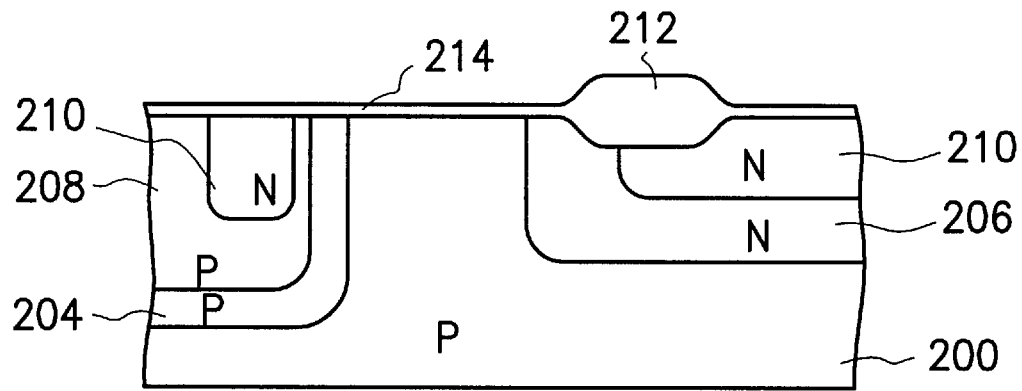

In FIG. 2C, after removing the oxide layer 202 of FIG. 2B, a fate oxide layer 214 and a field oxide (FOX) layer 212 are sequentially formed by a well-known conventional process. The FOX layer 212 is located on a portion of both the first N well 206 and the second N well 210 at one side closer to the first P well 204.

Figure 2D:
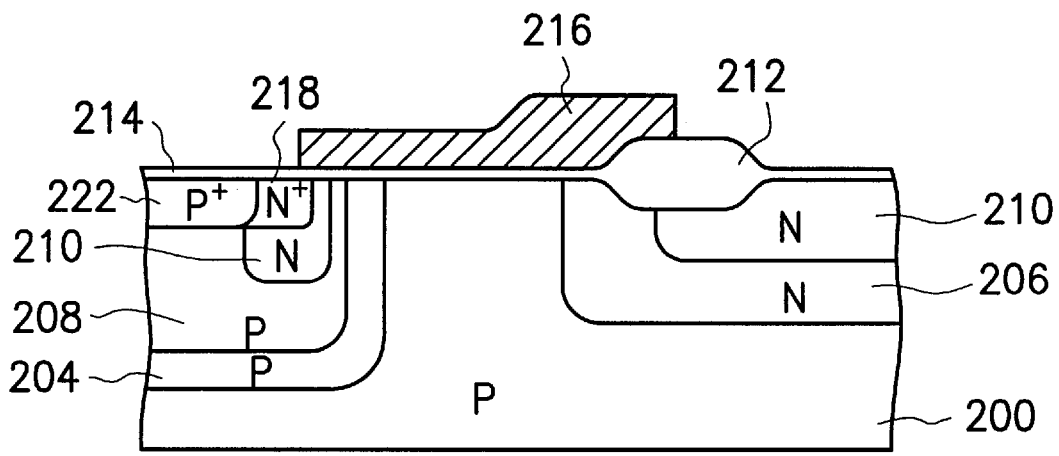

In FIG. 2D, a conductive layer (not shown) including, for example, polysilicon is formed over the substrate 200 and is patterned to form a gate 216, which is on a portion of the gate oxide layer and the FOX layer 212.

Figure 2E:
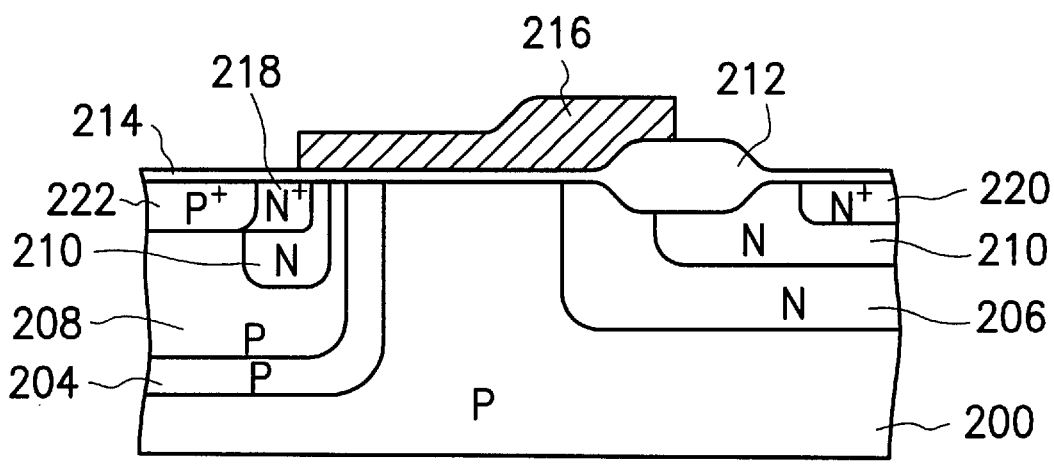

In FIG. 2E, using proper masking layers (not shown), N$^+$ ions are implanted into the second N well 210, and P$^+$ ions are implanted abutting to the N+ implanted region within the second P well 208. After a thermal process, such as an annealing process, is performed, a source region 218 and a drain region 220 are formed with N$^+$-type dopant, and a P$^+$ doped region 222 is formed simultaneously. The N+ doped regions 220, 218 have greater dopant density than that of the second N well. The drain region 220 on the second N well 210 is at one side of the FOX layer 212 further away the first P well 204. The P$^+$ doped region 222 on the second P well 208 has also a contact with the second N well 210 within the second P well 208. The dopant density of the P$^+$ doped region 220 is greater than that of the second P well 208. The P-type dopant density order from the lowest one to the highest one is the P-type substrate 200, the first P well 204, the second P well 208, and the P$^+$ doped region 222. The N-type dopant density order from the lowest one to the highest one is the first N well 206, the second N well 210, and the N$^+$ doped regions 218, 220. In the above descriptions, the masking layers used for implanting ions is a well-known technology. The formation and removing of the masking layer with a desired pattern of doped region is accordingly done without detailed descriptions.

The invention has provided a method to form a high-bias device as described in FIGS. 2A–2E. A structure of FIG. 2E is one of possible structures according to the method. A similar method can form several different structures. The different is that the number of wells included between the source/drain regions 218, 220 and the first P well 204/the first N well 206 can vary from zero to a few wells. The first embodiment has one second N well 210 and one second P well. A few structures based on the method of the invention are to described below. The part about the fabrication method is not redescribed.

EXAMPLE 2

Figure 3:
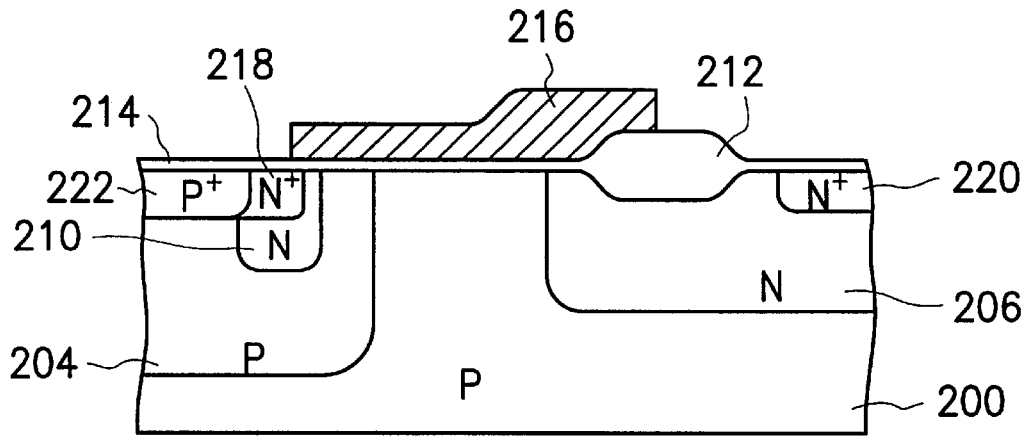
FIG. 3 is a cross-sectional view of an improved high-bias device, schematically illustrating a structure of the improved high-bias device according to a second preferred embodiment of the invention.

An another example is shown in FIG. 3. FIG. 3 is a cross-sectional view of an improved high-bias device, schematically illustrating a structure of the improved high-bias device according to a second preferred embodiment of the invention. A similar method described in the example 1 can also fabricate a structure shown in FIG. 3.

In FIG. 3, a semiconductor substrate, such as a P-type substrate 200, has a first P well 204 and a first N well 206. A second N well 210 is located inside the first P well 204. The P-type substrate 200 has a field oxide layer 212 and a gate oxide layer 214 on the top. The field oxide layer 212 is on the first N well 206 at one side closer to the first P well 204. The second N well 210 and the first N well 206 each respectively have an N$^+$ doped region 218 and an N$^+$ doped region 220, which respectively serve as a source region and a drain region. Within the first P well 204, there is a P$^+$ doped region 222 abutting to the N$^+$ doped region 218 so that the P$^+$ doped region 222 crosses over the second N well 210 with a portion of contact. A gate 216 is on the gate oxide layer 214 and covers at least a portion of the field oxide layer 212. For the same type of dopant, the doped region closer to the substrate has lighter dopant density. For example, the P-type dopant density order from the lowest one to the highest one is the P-type substrate 200, the first P well 204, and the P$^+$ doped region 222. The N-type dopant density order from the lowest one to the highest one is the first N well 206, the second N well 210, and the N$^+$ doped regions 218, 220.

EXAMPLE 3

Figure 4:
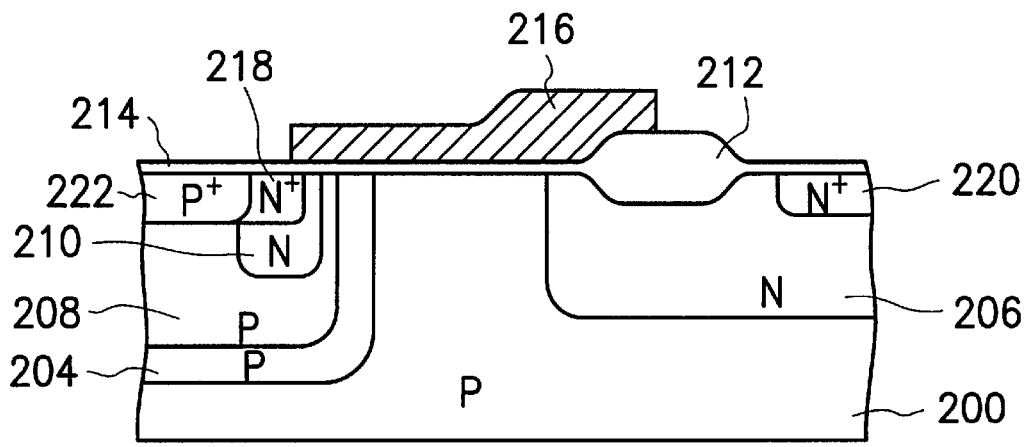
FIG. 4 is a cross-sectional view of an improved high-bias device, schematically illustrating a structure of the improved high-bias device according to a third preferred embodiment of the invention.

FIG. 4 is a cross-sectional view of an improved high-bias device, schematically illustrating a structure of the improved high-bias device according to a third preferred embodiment of the invention. A similar method described in the example 1 can also fabricate a structure shown in FIG. 4.

In FIG. 4, a semiconductor substrate, such as a P-type substrate 200, has a first P well 204 and a first N well 206. A second P well 208 is located inside the first P well 204. The second P well 208 has a second N well 210 inside. The P-type substrate 200 has a field oxide layer 212 and a gate oxide layer 214 on the top. The field oxide layer 212 is on the first N well 206 at one side closer to the first P well 204.

The second N well 210 and the first N well 206 each respectively have an N+ doped region 218 and N+ doped region 220, which respectively serve as a source region and a drain region. Within the second P well 208. there is a P+ doped region 222 abutting to the N+ doped region so that the P+ doped region 222 crosses over the second N 210 well with a portion of contact. A gate 216 is on the gate oxide layer 214 and covers at least a portion of the field oxide layer 212. For the same type of dopant, the doped region closer to the substrate has lighter dopant density. For example, the P-type dopant density order from the lowest one to the highest one is the P-type substrate 200, the first P well 204, the second P well 208 and the P+ doped region 222. The N-type dopant density order from the lowest one to the highest one is the first N well 206, the second N well 210, and the N+ doped regions 218, 220.

EXAMPLE 4

Figure 5:
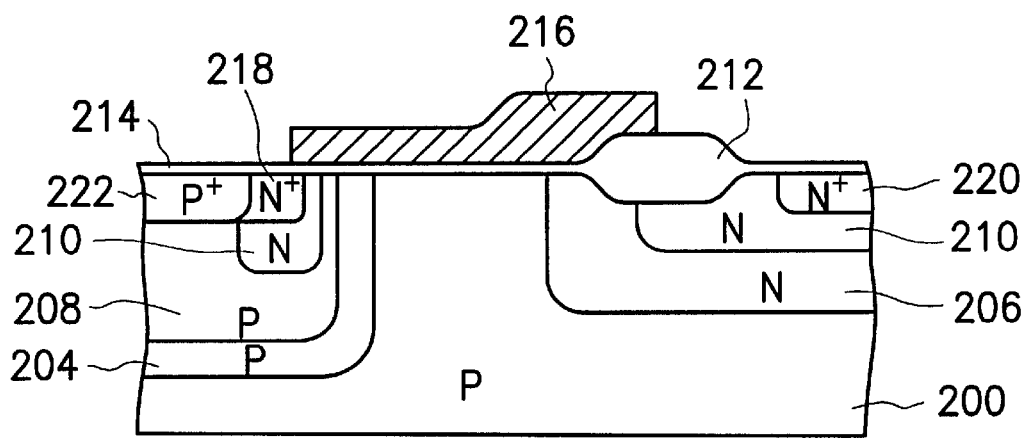
FIG. 5 is a cross-sectional view of an improved high-bias device, schematically illustrating a structure of the improved high-bias device according to a fourth preferred embodiment of the invention.

FIG. 5 is a cross-sectional view of an improved high-bias device, schematically illustrating a structure of the improved high-bias device according to a fourth preferred embodiment of the invention. A similar method described in the example 1 can also fabricate a structure shown in FIG. 5.

In FIG. 5, a semiconductor substrate, such as a P-type substrate 200, has a first P well 204 and a first N well 206. A second N well 210 is located inside the first P well 204 and the first N well 206. The P-type substrate 200 has a field oxide layer 212 and a gate oxide layer 214 on the top. The field oxide layer 212 is both on the first N well 206 and the second N well 210 at one side closer to the first P well 204. The second N well 210 has an N+ doped region 218 within the first P well 204 and an N+ doped region 220 within the first N well 206, which respectively serve as a source region and a drain region. Within the first P well 204, there is a P+ doped region 222 abutting to the N+ doped region 218 so that the P+ doped region 222 crosses over the second N well 210 with a portion of contact. A gate 216 is on the gate oxide layer 214 and covers at least a portion of the field oxide layer 212. For the same type of dopant, the doped region closer to the original substrate 200 has lighter dopant density. For example, the P-type dopant density order from the lowest one to the highest one is the P-type substrate 200, the first P well 204, and the P+ doped region 222. The N-type dopant density order from the lowest one to the highest one is the first N well 206, the second N well 210 and the N+ doped regions 218, 220.

In conclusion, the invention has several characteristics as follows:

1. The invention includes multiple N-type doped wells, such as the first N well 206 and the second N well 210, formed between the drain region 220 and the substrate 200 with an increasing order of dopant density from the first N well 206. The potential crowding phenomenon is effectively prevented from occurring. The drain region 220 does not directly contact with the substrate 200 so that the junction electric field is reduced. Therefore, the electric breakdown voltage is increased.

2. The invention includes multiple P-type doped wells, such as the first P well 204, the second P well 208, and a P+ doped region 222, between the source region 218 and the P-type substrate 200 with an increasing order of dopant density from the P-type substrate 200. The latch-up phenomenon is effectively avoided.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a high-bias device, the method comprising:

providing a P-type substrate;

forming an oxide layer on the substrate;

forming a first P well and a first N well in the substrate, wherein the first P well has greater dopant density than that of the substrate;

forming a second P well in the first P well;

forming a second N well separately in the first N well and in the second P well;

removing the oxide layer;

forming a gate oxide layer and a field oxide layer on the substrate, wherein the field oxide layer is on both the first N well and the second N well;

forming a gate layer on a portion of the gate oxide layer and the field oxide layer, wherein the gate layer extends to the second N well;

forming a source/drain region in the second N well, wherein the source/drain region is doped with an N-type dopant; and forming a P+ doped region abutting to the source/drain region in the second P well by implanting a P-type dopant.

2. The method of claim 1, wherein the step of forming the first P well and the first N well in the substrate further comprises:

implanting a P-type dopant in a desired region to form the P well;

implanting an N-type dopant in a region, where is desired to form the N well; and performing a thermal process to drive in the implanted ions.

3. The method of claim 1, wherein the second P well is formed by implanting P-type dopant into the first P well and performing a thermal drive-in process.

4. The method of claim 1, wherein the second N well is formed by implanting N-type dopant into the first N well and the second P well, and performing a thermal drive-in process.

5. The method of claim 1, wherein a dopant density of the second P well is greater than a dopant density of the first P well.

6. The method of claim 1, wherein a dopant density of the P+ doped region is greater than a dopant density of the second P well.

7. The method of claim 1, wherein a dopant density of the second N well is greater than a dopant density of the first N well.

8. The method of claim 1, wherein a dopant density of the source/drain region is greater than a dopant density of the second N well.

9. A method for fabricating a high-bias device, the method comprising:

providing a P-type substrate;

forming an oxide layer on the substrate;

forming a first P well and a first N well in the substrate, wherein the first P well has greater dopant density than that of the substrate;

forming a second N well in the first P well;

removing the oxide layer;

forming a gate oxide layer and a field oxide layer on the substrate, wherein the field oxide layer is on the first N well;

forming a gate layer on a portion of the gate oxide layer and the field oxide layer, wherein the gate layer extends to the second N well;

forming a source/drain region in the first N well and in the second N well, wherein the source/drain region is doped with an N-type dopant; and forming a P$^+$ doped region abutting to the source/drain region in the first P well by implanting a P-type dopant.

10. The method of claim 9, wherein the step of forming the first P well and the first N well in the substrate further comprises:

implanting a P-type dopant in a desired region to form the P well;

implanting an N-type dopant in a region, where is desired to form the N well; and performing a thermal process to drive in the implanted ions.

11. The method of claim 9, wherein the second N well is formed by implanting an N-type dopant into the first P well, and performing a thermal drive-in process.

12. The method of claim 9, wherein a dopant density of the P$^+$ doped region is greater than a dopant density of the first P well.

13. The method of claim 9, wherein a dopant density of the source/drain region is greater than a dopant density of the first N well and a dopant density of the second N well.

14. A method for fabricating a high-bias device, the method comprising:

providing a P-type substrate;

forming an oxide layer on the substrate;

forming a first P well and a first N well in the substrate, wherein the P well has greater dopant density than that of the substrate and wherein the first N well is physically separated from the first P well;

forming a second P well in the first P well;

forming a second N well in the second P well;

removing the oxide layer;

forming a gate oxide layer and a field oxide layer on the substrate, wherein the field oxide layer is on the first N well;

forming a gate layer on a portion of the gate oxide layer and the field oxide layer, wherein the gate layer extends to the second N well;

forming a source/drain region in the first N well and in the second N well, wherein the source/drain region is doped with an N-type dopant; and forming a P$^+$ doped region abutting to the source/drain region in the second P well by implanting a P-type dopant.

15. The method of claim 14, wherein a dopant density of the second P well is greater than a dopant density of the first P well.

16. The method of claim 14, wherein a dopant density of the P$^+$ doped region is greater than a dopant density of the second P well.

17. A method for fabricating a high-bias device, the method comprising:

providing a P-type substrate;

forming an oxide layer on the substrate;

forming a first P well and a first N well in the substrate, wherein the P well has greater dopant density than that of the substrate;

forming a second N well separately in the first N well and in the first P well;

removing the oxide layer;

forming a gate oxide layer and a field oxide layer on the substrate, wherein the field oxide layer is on both the first N well and the second N well;

forming a gate layer on a portion of the gate oxide layer and the field oxide layer, wherein the gate layer extends to the second N well;

forming a source/drain region in the second N well, wherein the source/drain region is doped with an N-type dopant; and forming a P$^+$ doped region abutting to the source/drain region in the first P well by implanting a P-type dopant.

18. The method of claim 17, wherein a dopant density of the P$^+$ doped region is greater than a dopant density of the first P well.

19. The method of claim 17, wherein a dopant density of the second N well is greater than a dopant density of the first N well.

20. The method of claim 17, wherein a dopant density of the source/drain region is greater than a dopant density of the second N well.

* * * * *